US012183410B2

(12) United States Patent
Vincenzi et al.

(10) Patent No.: US 12,183,410 B2
(45) Date of Patent: Dec. 31, 2024

(54) DATA STORAGE APPARATUS COMPRISING CELL SECTION OPERABLE AS DOSIMETER AND METHOD OF OPERATING

(71) Applicant: ams International AG, Jona (CH)

(72) Inventors: Tommaso Vincenzi, Graz (AT); Gregor Schatzberger, Graz (AT)

(73) Assignee: AMS INTERNATIONAL AG, Jona (CH)

( * ) Notice: Subject to any disclaimer, the term of this patent is extended or adjusted under 35 U.S.C. 154(b) by 146 days.

(21) Appl. No.: 18/248,542

(22) PCT Filed: Oct. 13, 2021

(86) PCT No.: PCT/EP2021/078285
§ 371 (c)(1),
(2) Date: Apr. 11, 2023

(87) PCT Pub. No.: WO2022/079089
PCT Pub. Date: Apr. 21, 2022

(65) Prior Publication Data
US 2023/0386592 A1    Nov. 30, 2023

(30) Foreign Application Priority Data

Oct. 14, 2020  (DE) ...................... 10 2020 126 995.1

(51) Int. Cl.
*G11C 29/02* (2006.01)
*G11C 7/08* (2006.01)

(52) U.S. Cl.
CPC .............. *G11C 29/022* (2013.01); *G11C 7/08* (2013.01); *G11C 29/021* (2013.01); *G11C 2207/2254* (2013.01)

(58) Field of Classification Search
CPC .................................. G11C 29/022; G11C 7/08
(Continued)

(56) References Cited

U.S. PATENT DOCUMENTS 7,551,470 B2   6/2009  Erickson et al.
8,369,141 B2   2/2013  Sommer et al.
(Continued)

FOREIGN PATENT DOCUMENTS

CN      109215715 B    6/2020
JP      2005149438 A   6/2005
(Continued)

OTHER PUBLICATIONS

Kumari, P. et al.: "State-of-the-Art Flash Chips for Dosimetry Applications" 2018 IEEE Radiation Effects Data orkshop (REDW), 2018, p. 1-4.—ISSN 2154-0535.*
Kumari, P. et al.: "Wireless Passive Radiation Dosimeter Using Flash Memory" 2018 6th IEEE International Conference on Wireless for Space and Extreme Environments (WISEE), IEEE, Dec. 11, 2018; pp. 239-245.*

(Continued)

*Primary Examiner* — Muna A Techane
(74) *Attorney, Agent, or Firm* — MH2 Technology Law Group LLP

(57) ABSTRACT

A data storage apparatus includes an integrated circuit further including a control unit and a memory array of charge-based memory cells. The memory array includes a first subsection which is operable as a memory, and includes a second subsection which is operable as a dosimeter. The control unit is operable to provide a reference current and to conduct memory access operations to access the memory with reference to the reference current. The control unit is further operable to analyze a statistical distribution of read currents by using memory access operations in the second subsection. Said analysis involves counting of logical read errors of the memory access operations and calibrating the reference current depending on a number of counted logical read errors being indicative also of a Total Ionizing Dose, TID.

15 Claims, 6 Drawing Sheets

(58) Field of Classification Search
USPC .................................................. 365/189.09
See application file for complete search history.

(56) References Cited

U.S. PATENT DOCUMENTS

| | | | |
|---|---|---|---|
| 9,684,463 B1* | 6/2017 | Alshinnawi | G06F 3/0616 |
| 10,509,132 B1 | 12/2019 | Ray et al. | |
| 10,740,020 B2* | 8/2020 | Gong | G06F 3/0616 |
| 10,878,922 B1 | 12/2020 | Ray | |
| 2008/0175055 A1 | 7/2008 | Kim | |
| 2008/0266984 A1 | 10/2008 | Chen et al. | |
| 2009/0003058 A1 | 1/2009 | Kang | |
| 2009/0146068 A1 | 6/2009 | Agarwal | |
| 2010/0124112 A1 | 5/2010 | Kasuga | |
| 2013/0080689 A1* | 3/2013 | Jo | G06F 12/0246 |
| | | | 711/E12.008 |
| 2013/0179624 A1 | 7/2013 | Lambert et al. | |
| 2016/0196076 A1* | 7/2016 | Oh | G11C 16/26 |
| | | | 711/103 |
| 2016/0259063 A1* | 9/2016 | Lee | G01T 1/023 |

FOREIGN PATENT DOCUMENTS

| | | |
|---|---|---|
| JP | 2008165955 A | 7/2008 |
| JP | 2009009688 A | 1/2009 |
| JP | 2010123192 A | 6/2010 |

OTHER PUBLICATIONS

Esposito, M. et al.: "Radiation hardness of a large area CMOS active pixel sensor for biomedical applications" 2012 IEEE Nuclear Science Symposium and Medical Imaging Conference Record (NSS/MIC), Anaheim, CA, 2012, pp. 300-1304.*

Gserardin, S. et al.: "Present and Future Non-Volatile Memories for Space" IEEE Transactions on Nuclear science, Dec. 2010, vol. 57, No. 6, pp. 3016-3039.*

Decision to Grant a Patent issued in correspondence Japanese Patent Application No. 2023517344 dated May 31, 2024, with English translation, 4 pages.

Wolff, N. (Authorized Officer), International Search Report and Written Opinion dated Jan. 24, 2022, PCT Application No. PCT/EP2021/078285, 10 pages.

Kumari, P. et al.: "State-of-the-Art Flash Chips for Dosimetry Applications" 2018 IEEE Radiation Effects Data Workshop (REDW), 2018, p. 1-4.—ISSN 2154-0535.

Esposito, M. et al.: "Radiation hardness of a large area CMOS active pixel sensor for biomedical applications" 2012 IEEE Nuclear Science Symposium and Medical Imaging Conference Record (NSS/MIC), Anaheim, CA, 2012, pp. 1300-1304.

Gerardin, S. et al.: "Present and Future Non-Volatile Memories for Space" IEEE Transactions on Nuclear Science, Dec. 2010, vol. 57, No. 6, pp. 3016-3039.

Vincenzi, T. et al.: "Program Time Effects on Total Ionizing Dose Tolerance of Sidewall Spacer Memory Bit Cell" 2019 Austrochip Workshop on Microelectronics, Vienna, Austria, 2019, pp. 55-58.

Beller; German Search Report issued in DE Patent Application No. 10 2020 126 995.1 dated Jun. 9, 2020, 6 pages.

* cited by examiner

Evolution of distribution parameters of the SwSpc READ Current

Reading window in a differential Cell for various pulse times

DATA STORAGE APPARATUS COMPRISING CELL SECTION OPERABLE AS DOSIMETER AND METHOD OF OPERATING

CROSS-REFERENCE TO RELATED APPLICATIONS

The present application is the national stage entry of International Patent Application No. PCT/EP2021/078285, filed on Oct. 13, 2021, and published as WO 2022/079089 A1 on Apr. 21, 2022, which claims the benefit of priority of German Patent Application No. 10 2020 126 995.1, filed on Oct. 14, 2020, the disclosures of all of which are incorporated by reference herein in their entireties.

FIELD OF DISCLOSURE

This disclosure relates to a data storage apparatus, an electronic device and to a method operating a data storage apparatus.

Background

For many decades, memory technologies have been successfully scaled down to achieve higher speed and increased density of memory chips at lower bit cost. The problem of circuit reliability in electronics has always proceeded together with integration. In fact, the downscaling of technology is limited exactly by the reliability problem itself. In radiation active environments, reliability-oriented design may even be more important and requires dedicated attention. Memories are of course no exception, as they are a core part of almost every electronic system. So they have to be tolerant to the same environment. Historically there are many solutions to harden non-Volatile memories, depending on the application considered, from using innovative materials to smart layout techniques, until the more high-level solutions of Error Correction Coding and circuit redundancy. Moreover, memory structures have been historically used also as dosimeters, especially charge-based ones exploiting the intrinsic sensitivity of charge to Total Ionizing Dose (TID).

Two issues are tied together, i.e. having a radiation tolerant design on one side and being aware of the wear level of the system on the other. Prior art solutions, either involve rather complex structures for controlling memory wear, or add together separate self-standing blocks that interact then via a higher abstraction layer. Moreover, such solutions either lack in accuracy of defining effective memory wear, e.g. if the dosimeter has a different technology or material compared to the memory device, or require a full scan of the memory to assess the damage level.

FIG. 9 shows an embodiment of a prior art data storage apparatus. The device can be used for CMOS based Non-Volatile Memory architectures. Such memory includes a control logic block 100, a column control and data buffers block 200, a row control block 300 and a memory array block 400. The control block 100 includes a reference current source which provides a reference current IREF, for READ memory access operations in direct comparison with single-ended Bit Cell structures, for example and the logic to drive the memory architecture. The block 200 comprises data buffers, output drivers and in general column control of the memory array. In row control block 300, there are word line drivers and generally row controllers of the memory array. The memory array block 400 comprises an array of memory bit cells to store information. Memory access operations can be implemented as single-ended or differential architectures. For example, in single-ended architectures, READ operations are performed in a data buffer block of block 200, typically through current comparators. The READ operation is successful if the comparator returns the correct last written operation on the bit cell, either erased or programmed in case of the single-ended version or the correct programmed side for a differential architecture.

FIG. 10 shows an ideal distribution of the read current of charge-based bit cells. As the figure shows, there is a clear open window between the distributions of programmed cells and erased cells, and the optimal position for the reference current IREF in the comparator is in the middle of said window. Adaptive reference procedures for reading non-volatile memory bit cells have been explored e.g. based on monitoring the Cumulative Distribution Function (CDF) of the voltage threshold of all the bit cells in the array.

A problem with this kind of approach for robustness is that the whole memory array is swept in order to establish the optimal position for the reference current IREF. This makes the algorithm complexity cost directly related to the dimensions of the memory array, therefore given N the number of Bit Cells in the Flash Memory, given B the number of bits available to tune the reference current IREF, the algorithm complexity to find the optimal threshold is:

$$O(N,B)=2^B+N.$$

Considering that for a specific case with B<10 and N>1000, both addenda are important to compute the overall complexity. It is immediately clear that with big memory arrays such analysis becomes computationally cumbersome. Furthermore, considering that the memory alone does not have a dosimeter functionality, the system demands a separate device to estimate the radiation wear level.

It is an object of the present disclosure to provide a data storage apparatus, an electronic device and a method of operating a data storage apparatus with improved radiation tolerance and improved awareness of the radiation wear level.

These objects are achieved by the subject matter of the independent claims. Further developments and embodiments are described in the dependent claims.

It is to be understood that any feature described in relation to any one embodiment may be used alone, or in combination with other features described herein, and may be used in combination with one or more features of any other of the embodiments, or any combination of any other of the embodiments unless described as an alternative. Furthermore, equivalents and modifications not described below may also be employed without departing from the scope of the display, display device and method to operate a display which are defined in the accompanying claims.

SUMMARY

The following relates to an improved concept in the field of memory technology. The improved concept achieves both wear control and a dosimetry estimate in a single integrated data storage apparatus. The apparatus comprises a hybrid memory circuit including charge-based memory cells, such as sidewall spacer memory bit cells. One subsection of an array of charge-based memory cells is operated as a memory while another subsection is dedicated to operate as a dosimeter. Using continuous calibration of the reference current, it is possible to obtain both an adaptive and status aware system, capable of monitoring the radiation absorption to the whole circuit.

In at least one embodiment, a data storage apparatus comprises an integrated circuit which further comprises a control unit and a memory array of charge-based memory cells. The memory array comprises a first subsection and a second subsection.

During operation of the data storage apparatus the first subsection of the memory array operates as a memory. The second subsection of the memory array, however, operates as a dosimeter.

The control unit provides a reference current and conducts memory access operations to access the memory with reference to the reference current. Furthermore, the control unit analyzes a statistical distribution of read currents by using memory access operations in the second subsection. The analysis involves counting of logical read errors of the memory access operations and calibrating the reference current depending on a number of counted logical read errors. The number of counted logical read errors is indicative also of a Total Ionizing Dose, TID.

The proposed data storage apparatus improves on radiation tolerance and awareness of the radiation wear level in a single device. In fact, the two issues of having a radiation tolerant design and the awareness of the wear level of an electronic system are tied together. The improved concept addresses both in a unique fashion. In a certain sense the data storage apparatus constitutes a hybrid memory circuit which achieves both wear control and a dosimetry estimate based on charge-based memory cells, such as sidewall spacer memory bit cells, for example. Thanks to the array of charge-based memory cells in the second subsection dedicated to dosimetry and thanks to a calibration of the data storage apparatus, it is possible to obtain both an adaptive and status aware system, which is capable of monitoring radiation absorption to the whole apparatus, and any electronic device that comprises the data storage apparatus.

In many applications, there may be a technical advantage in monitoring data retention wear out of the memory array. For example, this may be true for most medical, high energy physics and space applications, where radiation hardness is an important parameter for a designed architecture. The proposed data storage apparatus combines the use of a dosimeter and a memory in a single device. This combination of memory and dosimeter is applied on the scale of the memory array of charge-based memory bit cells itself, with just a rather small addition of circuits and logic. In particular, given N the number of charge-based memory cells in the memory array, the architecture of the proposed concept may have a number of charge-based memory cells equivalent to:

$$N'=N(1+\alpha).$$

N' is the total number of charge-based memory cells in the memory array, and parameter a denotes the fraction of the charge-based memory cells dedicated to the second subsection, i.e. for the dosimetry operation, wherein 0<a<1.

Due to the nature of the dosimeter and memory blocks, it is safe to assume that both subsections will behave in the same way and that damage caused by the Total Ionizing Dose, TID, is of the same nature. In fact, ionizing radiation has a very specific effect on charge-based bit cells, such as sidewall spacer memory bit cells. Considering that the stored information depends on the amount of electric charge deposited in specific layers, and ionizing radiation affects the movement of electronic charge, the information stored in the memory cells may be degraded. It has been shown that this degradation is monotonic and tends to eliminate charge which has been pumped into the memory cells, e.g. in a nitride spacer or isolated conductive layer. In other words, it is possible to correlate the TID with the charge stored in the cells. This finding is encoded in the amount of logical read errors. In fact, as the data storage apparatus continues to be exposed to ionizing radiation the movement of electronic charge leads to an increase in logical read errors of memory access operations. Counting the number of logical read errors not only allows for calibrating the reference current but in itself is indicative also of the Total Ionizing Dose, TID.

In conclusion, the improved concept has multiple advantages, including compliance with standard CMOS processes, use of the same circuitry for reading and writing memory and dosimeter, compact and integrated design thanks to the layout of the charge-based memory cells and the memory itself. Moreover, the overall system offers flexibility on the data elaboration out of the dosimeter to define the current reference, using in equal terms embodiments with maximum non-overlapping current or a certain percentile of the estimated Cumulative Distribution Function, CDF.

Hereinafter, a charge-based memory will be considered any type of semiconductor memory that encodes data as a charge amount. An example is the Sidewall spacer memory bit cells, but also charge-trapping bit cells as is SONOS and the widely available Floating Gate bit cells. The term "memory" relates to a device where data is stored within a semiconductor, e.g. a metal-oxide-semiconductor, MOS, by memory cells on an integrated circuit memory chip. The memory can be accessed by memory access operations. Bits of binary data are stored in the memory cells. The memory access operations include the basic operations "read", in which the data contents of a memory word is read out non-destructively, and "write" in which data is stored in a memory word, replacing any data that was previously stored there. The memory cells are accessed with reference to the reference current. Furthermore, a given memory cell can be accessed by its characteristic read and/or write current.

Charge-based memory cells are typically read by comparing read currents (or storage values) stored in the cells to one or more thresholds, e.g. one or more reference currents. Without environmental damage to the memory, the number of memory cells resemble a statistical distribution of read currents. This distribution is denoted "statistical distribution of read currents" hereinafter. The distribution may have two separate curves, which can be associated with "programmed" and "erased" memory cells. These two curves may be separated by a certain current open window, or "delta". The reference current may be located at a current value within an interval defined by delta. For example, the reference current may be set to delta/2.

In at least one embodiment, the memory cells of the second subsection are pre-charged to have a low read current and are programmed before the use of the memory macroblock, i.e. the first subsection. In this way memory cells of the second subsection can be prepared to be used as a dosimeter. A read current is considered "low" when a read current in the statistical distribution of read currents lies within the 10% or 1% smallest read current values. An actual "low" read current may be determined by the application at hand. For example, for a specific CMOS technology, e.g. 65 nm, for Sidewall Spacer, a low read current is between 0 and 10 to 15 µA. A high read current may be between 25 and 40 µA. This however may change with the technology process. For example, using 180 nm yields different read currents. Thus, through an initial characterization of the technology one can say what defines as "low" and what as "high" and if the memory is going to work, i.e. if the read window is big enough to be reliable.

In at least one embodiment, the data storage apparatus comprises a column control block. The column control block comprises comparators that are operable to compare read currents with the reference current. While in operation of the data storage apparatus, the column control block may control memory access operations. During these operations, the comparators compare read currents with the reference current, respectively.

For example, data content of a memory word is read out from a particular memory cell, i.e. the memory cells are accessed with reference to the reference current using its characteristic read current. This happens under control of the column control block. The read current of the particular memory cell is then compared with the reference current in order to detect possible logical read errors, which may occur due to radiation exposure. The column control block and comparators constitute electronic components that can be used for both the first and second subsection, i.e. for memory and dosimeter. Thus, there may be no need to implement dedicated electronics for each functions separately. This further improves on space requirements and cost efficiency.

In at least one embodiment, the comparators comprise current sense amplifiers. The current sense amplifiers are configured in a single-ended or in a differential structure. The current sense amplifiers compare read currents with the reference current.

In at least one embodiment the column control block further comprises a data buffer and a bitline driver. A row control block comprises a wordline driver. The data buffer, bitline and wordline driver provide control of the memory in order to read from or write to a particular memory cell. The data buffer, bitline and wordline driver constitute electronic components that can be used for both first and second subsection, i.e. for memory and dosimeter. This further improves on space requirements and cost efficiency.

In at least one embodiment, the control block comprises a counter. The counter is configured to analyze the statistical distribution of read currents in the second subsection as a function of a number of memory cells. The analysis involves, using the comparators, e.g. current sense amplifiers, to successively compare read currents from the statistical distribution of read currents with the reference current. For each comparison, a logic TRUE or FALSE signal is generated, depending on whether the comparison meets a comparison criterion or not.

For example, the comparison criterion is met when a read current is smaller or larger than the reference current or not. Typically, a logical FALSE signal, is generated when a read current is higher than the reference current and, thus, indicating a logical read error. Depending on the actual design of the memory, this criterion may also be reversed. Finally, the number of logical FALSE signals are counted as number of counted logical read errors.

The charge-based memory cells are affected by the radiation they are exposed to. As explained above the radiation may alter charges or distribution of charges in the cells. As the memory cells store data a charge state radiation exposure may lead to a loss of information. In turn, this loss of information can be seen in the number of counted logical read errors. Thus, the number of counted logical read errors may have a double purpose.

First, said number can be used to calibrate the reference current. The radiation induced changes in charge and charge distribution in the cells may have an impact on the statistical distribution of read currents. The curves associated with "programmed" and "erased" memory cells may shift in current and the "delta" may, thus, change as well. The number of counted logical read errors represents the shift and, in turn, allows for determining the "delta" or, in other words, the reference current. Calibrating for the reference current may improve accuracy and reliability of the memory despite its exposure to hazardous radiation.

Second, the number of counted logical read errors is also a measure of TID. For example, depending on the programming of memory cells, e.g. program pulse times, in the second subsection the number of counted logical read errors can be correlated to yield the TID. Thus, in addition to improving accuracy and reliability, the number of counted logical read errors provides a convenient way to determine the Total Ionizing Dose, TID with a single hybrid device.

In at least one embodiment, the control block is operable to analyze the statistical distribution of read currents by executing the following steps. First, under control of the control block, data is stored in the memory array by writing first storage values to the charge-based memory cells of the second subsection. Second storage values are read from the charge-based memory cells of the second subsection, respectively. The number of charge-based memory cells of the second subsection, which return logical FALSE signals, thus indicating a read current being higher than the reference current and indicating a logical read error, are counted.

The operations of writing and reading storage values are the same for both the first and second subsection of the memory array. Thus, the number of counted logical read errors, and the measure of reference current and TID, can be established with electronics shared between the subsections. There is no need to provide dedicated electronics for memory and dosimeter functionality. This saves space and reduces cost.

In at least one embodiment the control block may calibrate the reference current as a function of the number of counted logical read errors. The calibrated reference current is then set as the reference current to perform memory access operation on the memory cells.

In at least one embodiment, a number of charge-based memory cells of the first subsection is larger than a number of charge-based memory cells of the second subsection.

In order to achieve a desired accuracy of the dosimeter, the second subsection may be arranged with a certain amount of memory cells dedicated to the dosimeter function. The distribution of read currents during a read memory access operation tends to be the same the bigger the dimensions of both subsections of the memory array are and for as long as the same program and erase operations are used. Therefore, a dimension of the dosimetry array can be set in view of achieving a desired statistical pool. This also supports obtaining a convergence of the distributions of the two subsections.

In at least one embodiment, the second subsection comprises at least one block of memory cells having the same programming. Said same programming corresponds to the programming of the memory cells of the first subsection.

In at least one embodiment, the second subsection may be further subdivided into blocks of memory cells, wherein the cells from a same block have the same programming. For example, the block with the highest program pulse time of blocks may be the last to fail.

At least one block with the same programming as the memory cells in the first subsection allows for direct comparison between the memory cells associated with the first subsection (memory) and the second subsection (dosimeter). For example, in general it may safely be assumed that the cells of the second subsection are affected in the same way as those of the first subsection. Since the radiation affects both arrays equally, the shift in the distribution of both arrays will also be the same. Moreover, due to the nature of the first and second subsection as memory and dosimeter it is possible to assume that both arrays will behave in the same way and that the damage caused by Total Ionizing Dose is of the same nature.

In at least one embodiment, the charge-based memory cells used in the first and second subsection are of the same type. Thus, the separation into first and second subsection may only be a question of different driving and programming. The functionality of memory and dosimeter may thus be achieved from one common array of charge-based memory cells, e.g. integrated into a single common die.

In at least one embodiment, at least for the block of same programming, the control block is operable to determine from the read currents a number of logical read errors being a measure of the Total Ionizing Dose, TID.

For example, ionizing radiation has a very specific effect on charge-based memory cells, such as sidewall spacer memory bit cells. Considering that the stored information depends on the amount of electric charge deposited in specific layers, and the effect of ionizing radiation on these devices relates to movement of electronic charge in the stack of layers, the information stored may be degraded depending on the TID. This degradation may be monotonic and tends to eliminate the charge pumped in the cells, e.g. nitride spacers. Therefore, it is possible to correlate the TID with the charge stored in the cells at a time.

In at least one embodiment, the second subsection is sub-divided into blocks of memory cells of different pre-charge conditions. Each block has a different pulse time for programming, respectively. The different pre-charge conditions or pulse times for programming allow to adjust or extend a detection range of the dosimeter. In fact, the number of counted logical errors in the different blocks correlates with the Total Ionizing Dose.

For example, for a first pre-charge condition a given number of counted logical errors corresponds to a first TID value. However, for a second pre-charge condition a given number of counted logical errors may correspond to a second TID value but different value. The set of pre-charge conditions or pulse times for programming defines how the number of counted logical errors can be translated into TID values. Furthermore, the set of pre-charge conditions or pulse times for programming defines a measurement range of the dosimeter. The number of blocks of memory cells of different pre-charge conditions may be any number starting from 1 and may be limited by the desired measurement range only.

In at least one embodiment, the following equation holds:

$$\frac{N \cdot a}{M} \geq 200.$$

Herein N denotes the total number of charge-based memory cells of the first subsection, parameter a denotes a fraction of the total number of charge-based memory cells comprised by the second subsection and M denotes a number of blocks in the second subsection.

The second subsection dedicated to dosimetry comprises a certain area. This area, or number of cells in the second subsection, has an impact on accuracy of the measurement. The size of the dosimeter can also be adjusted to fit the type of environment it operates in. A minimum size of the blocks may be respected in order to achieve a desired accuracy, e.g. to maintain statistical coherence. The system is adaptable in terms of how many of these blocks are necessary to obtain the desired accuracy. The limit suggested by the equation above has been found to support statistical coherence for many environments.

In at least one embodiment, the memory cells comprised by the second subsection are never reprogrammed or refreshed after the initial conditioning of said subsection, in particular, programmed with a specific pulse time.

As has been discussed above, radiation has the effect to alter charge and charge distribution throughout the memory. Consequently, the reference current for memory access operations may need to be calibrated in order to keep the data storage apparatus reliable despite being exposed to hazardous radiation. This procedure may be complemented with reprogramming, e.g. of pulse times. However, the memory cells comprised by the second subsection may not be reprogrammed and, thus, stay at their initial programming condition. When memory cells belonging to the dosimetry array are never refreshed, these map the worst possible case for data retention (worst-case scenario). This way the reported number of counted logical errors and TID values are recorded with respect to the initial condition of the data storage apparatus. In other words, the reported TID is in fact a measure of the whole lifetime of the apparatus.

In at least one embodiment, an electronic device comprises a data storage apparatus according to one or more aspects discussed herein. Furthermore, the electronic device comprises a host system. Any host system that is supposed to operate under harsh radiation conditions may benefit from having the data storage apparatus. For example, the host system may include at least one of:

a medical device,
an aeronautics device,
a high energy physics detector,
an integrated wear-controlled space device,
a portable mobile device for personal use,
a portable detector for food radioactivity, or
a portable detector for checking surrounding radioactive activity.

In at least one embodiment a method of operating a data storage apparatus is applied to an apparatus comprising an integrated circuit having a control unit and a memory array of charge-based memory cells. Herein, the memory array comprises a first subsection that is operable as a memory, and comprises a second subsection of charge-based memory cells which is operable as a dosimeter. The method comprises the steps of using the control unit and providing a reference current. Memory access operations are conducted to access the memory with reference to the reference current to analyze a statistical distribution of read currents. A number of logical read errors of the memory access operations in the second subsection are counted. Finally, the reference current is calibrated depending on the number of counted logical read errors being indicative also of a Total Ionizing Dose, TID.

In at least one embodiment the memory is programmed with various pulse times and/or pre-charge conditions by writing first storage values to the charge-based memory cells of the second subsection. Second storage values are read from the memory cells with reference to the reference current. Logical read errors are counted in the second subsection, respectively, and are indicative of a first reference condition, i.e. with reference to the reference current. Second storage values are then read from the memory cells also with reference to at least one intermediate reference current which is different to the reference current of the first reference condition. Logical read errors are counted in the second subsection with reference to the intermediate reference current and are indicative of a second reference condition. The numbers of logical read errors for the first and at least the second reference condition are then compared. The reference current is calibrated such that the reference current with the smaller number of logical errors is set as "new" reference current.

Further embodiments of the method of operating a data storage apparatus according to the improved concept become apparent to a person skilled in the art from the embodiments of the data storage apparatus and the electronic device described herein.

The proposed concept described herein has some advantages compared to a solution that uses dedicated memory and dosimetry blocks, and the same is true for the use of individual blocks. In comparison with the use of a system that uses two blocks for the functions of memory and dosimeter, there is a considerable improvement in terms of area efficiency, since most of the operations are performed exactly with the same circuitry. Moreover, the use of the same structures for both blocks helps in the detection of the failure time of the system, aided with the proximity in the layout.

The possible issue compared to the use of a dedicated dosimeter may relate to the accuracy and the non-linearity of the system itself. Since in fact the proposed concept may rely on a failure of specific blocks of the dosimeter, even including statistical techniques to improve the granularity of the detected dose, the quantization error and the accuracy may not match those of a dedicated block. As it may already become clear from the description above, the more relevant comparison to put the presented invention into perspective may be with respect to the memory block only, which does not have a dosimeter section. In fact, with an expense in terms of area (only a bigger memory array) to grant a meaningful statistical pool, it is possible to track the wear level of the whole memory, with the additional information on the TID level, relevant for an electronic device used with the data storage apparatus as well. This added functionality may especially prove valuable in harsh environments, as in medical, high-energy physics and space applications, to have a reliable idea on the status of the system and the margin to failure.

In terms of computational complexity, two different operations require this analysis: the determination of the TID level and the calibration of the reference. In particular, the determination of the TID level may require a read operation on the whole dosimetry area Na and thus is proportional to the size of the dosimetry array. In order to calculate the dose deposited on the electronic device it is necessary to count the amount of logical errors during said operation, determining the statistical distribution of the results. Clearly the complexity is impacted mostly by the size of the memory array (thus the value of a) that may need to be sufficiently large to be a significant statistical pool but small enough not to have the computational operation too heavy. The decision over where to place this trade-off point strongly depends on the application, i.e. on the desired accuracy and the availability of area of the whole system.

The same thought process applies on the calibration of the reference, e.g. the reference current for a single-ended memory cell structure or a memory cell bias for a differential one, with the addition of the separation of the dosimetry array in M blocks with different programming depth (pulse time in program operation). In particular, charge pumped in the storage layer of memory cells in different blocks may also be different depending on the granularity of the analysis on the TID level. As mentioned above, one of these blocks may have the same programming depth as the first subsection of the memory array to achieve an optimum injected charge with a reasonable trade-off between endurance and data retention. This may be the block to analyze to achieve the optimum for the reference itself. Thus, the complexity may be proportional to the size of the block of the dosimetry array, multiplied by binary accuracy of the digital calibration:

$$O\left(\frac{Na}{M}, B\right) = B\frac{Na}{M}$$

Applications that operate in a harsh environment could benefit greatly from the monitoring of the damage on the system, have a great computational and area advantage in the use of the proposed concept. In particular, all integrated systems that include a data storage apparatus as suggested would solve two important problems with only one device.

The following description of figures of example embodiments may further illustrate and explain aspects of the improved concept. Components and parts with the same structure and the same effect, respectively, appear with equivalent reference symbols. Insofar as components and parts correspond to one another in terms of their function in different figures, the description thereof is not necessarily repeated for each of the following figures.

DETAILED DESCRIPTION

Figure 1:
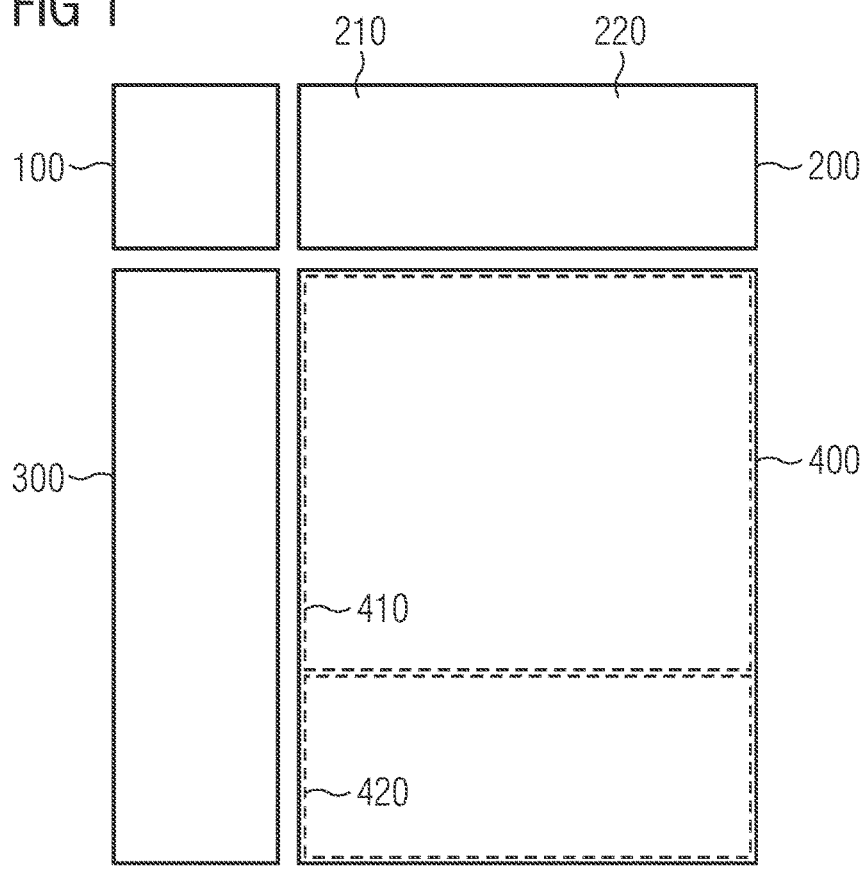
FIG. 1 shows an example embodiment of a data storage apparatus.

FIG. 1 shows an example embodiment of a data storage apparatus. The data storage apparatus comprises an integrated circuit which further comprises a control unit 100, a column control and data buffers block 200, a row control block 300 and a memory array 400 of charge-based memory cells. The control unit 100 comprises logic or a processor to control operation and driving of the data storage apparatus, e.g. for controlling memory access operations. Furthermore, the control unit 100 comprises a reference current source that provides a reference current Iref, for said memory access operations, such as read memory access operations.

Furthermore, the control unit 100 comprises logic, such as digital and analog functional units, for the calibration of the reference current Iref, e.g. a counter to analyze a statistical distribution of memory access operations, such as correct read operations. The column control and data buffers block 200 comprises data buffers 210 and a bit line driver 220. The row control block 300 comprises row controllers of the memory array such as word line drivers.

The memory array 400 comprises a first subsection 410 and a second subsection 420. Both subsections comprise charge-based memory cells of the same type. The charge-based memory cells comprise sidewall spacer memory bit cells, for example. The subsections have different functionality. The first subsection 410 operates as a memory (also denoted memory subsection) and the second subsection 420 operates as a dosimeter (also denoted as dosimeter subsection).

Operation of memory and dosimeter section, i.e. first subsection 410 and second subsection 420, is controlled by the control unit 100. For example, memory access operations to access the memory are conducted with reference to the reference current, provided by the control unit. The control unit analyzes a statistical distribution of read currents using memory access operations in the second subsection 420. This analysis involves counting of logical read errors of the memory access operations. A number of logical read errors results from the counting process. As will be discussed in further detail below the number of logical read errors allows for calibrating the reference current and is indicative of a Total Ionizing Dose, TID.

Figure 2:
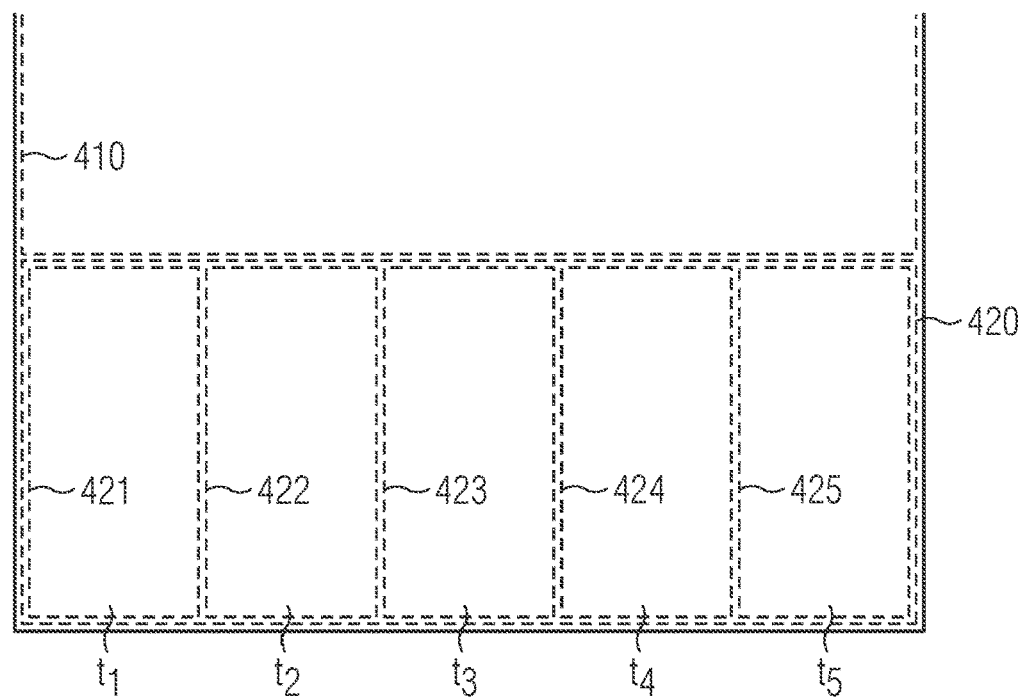
FIG. 2 shows an example embodiment of a dosimeter subsection.

FIG. 2 shows an example embodiment of a dosimeter subsection. The dosimeter subsection, i.e. the second subsection 420, is further subdivided into blocks of memory cells. Depicted are five blocks 421, 422, 423, 424, 425 as an example. The number of blocks may differ depending on the actual implementation. The memory cells in a block have a same pre-charge condition, e.g. program times or pulse times for programming. However, memory cells from different blocks have different pre-charge conditions, respectively. Furthermore, block 421 of memory cells initially has the same pre-charge condition as the memory cells of the first subsection 410.

Figure 3A:
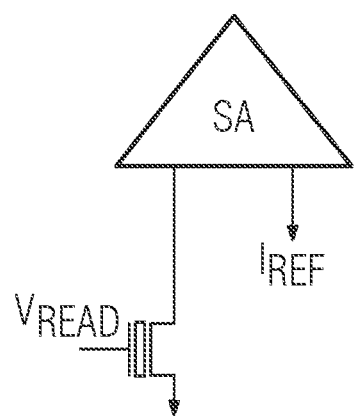
FIG. 3 shows an example embodiment of a sense amplifier architecture.
Figure 3B:
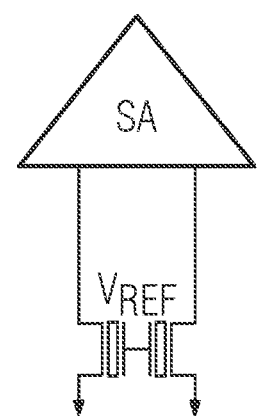

FIG. 3 shows an example embodiment of a sense amplifier architecture. The column control block may control memory access operations based on the reference current Iref provided by the control unit 100. For this purpose, the column control block 200 comprises comparators. In this embodiment said comparators are implemented as current sense amplifiers SA. There are at least two basic concepts from which the sense amplifier architecture of the column control block derives: a single-ended (see left side of the drawing) or a differential structure (see right side of the drawing). The current sense amplifiers compare read currents Iread with the reference current Iref.

In the following basic operation and design considerations of the embodiments from FIGS. 1 to 3 will be discussed in further detail.

Figure 4:
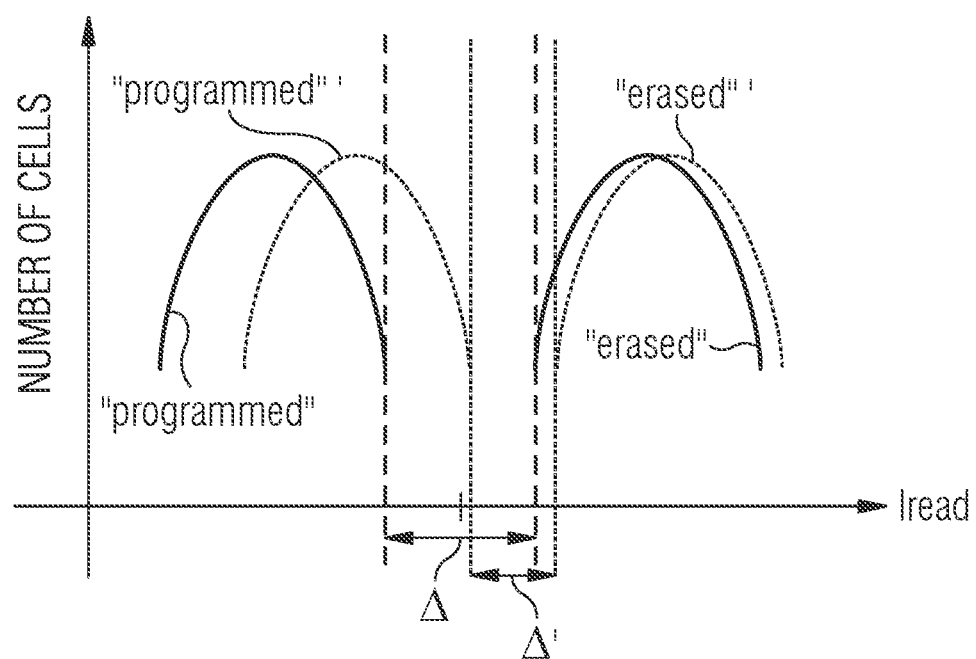
FIG. 4 shows an example distribution of read currents and the exemplified effect of TID of said distribution.

FIG. 4 shows an example distribution of read currents and the exemplified effect of TID of said distribution. The graph shows the number of memory cells in the memory array 400 as a function of read current Iread. Memory access operations include the basic operations "read", in which the data contents of a memory word is read out non-destructively, and "write" in which data is stored in a memory word, replacing any data that was previously stored there. The memory cells are accessed with reference to the reference current Iref. Furthermore, a given memory cell can be accessed by comparing read or write currents (or storage values) stored in the cells to one or more thresholds, e.g. reference current Iref. The graph shows two distributions of "programmed" cells and "erased" cells. There is an open window $\Delta$ between the two distributions. An optimal position for the reference current Iref, which is used as the reference in the comparator, can be placed in the middle of said window $\Delta$.

In its initial condition, the data storage apparatus, including the memory array 400, i.e. both first and second subsection 410, 420, have not yet been exposed to hazardous radiation. This condition may be characterized by an "initial" reference current Iref, which derives from the open window $\Delta$ discussed above. The initial condition will change when the data storage apparatus is exposed to hazardous radiation. In fact, ionizing radiation has a very specific effect on charge-based bit cells. Stored information depends on an amount of electric charge, which is deposited in the memory cells as a result of the memory access operations. Ionizing radiation affects the movement of electronic charge in the cells and information stored therein as charge may be degraded. As a result, the distribution of read currents is shifted away from the initial condition.

For example, two distributions of programmed cells and erased cells are separated by a different shifted open window $\Delta'$. Typically, the open window is reduced due to exposure to radiation. The shift can be seen as an indication of environmental damage and provides a means to estimate the TID. This will be explored in further detail below. Due to the radiation damage, the initial reference current may not be at its optimal position any longer. Thus, in order to assure operation of the data storage apparatus, i.e. memory subsection 410, despite exposure to radiation, the reference current Iref needs calibration. In a calibrated condition, a calibrated reference current Iref' based on the shifted open window $\Delta'$ becomes the reference current Iref.

Since the radiation affects both first and second subsections 410, 420 of the memory equally, the shift in the distribution of both memory arrays will also be the same. Moreover, due to the nature of the dosimeter and memory subsections it is possible to assume that both arrays will behave in the same way and that the damage caused by Total Ionizing Dose (TID) is of the same nature. In order to determine the TID deposited on the data storage apparatus, the dosimetry subsection 420 can be programmed to identify a worst-case scenario, e.g. at fabrication stage of the data storage apparatus. The initial programming includes various pulse time or pre-charge conditions, e.g. by writing first storage values to the charge-based memory cells of the second subsection 420.

This initial programming of the dosimetry subsection 420 is then never refreshed across the lifetime of the data storage apparatus. This is because in this case the data retention of the charge based memory cells in the dosimetry subsection will be always in the worst possible condition, i.e. are never refreshed, and, thus, are tied to the lifetime of the device itself. Moreover, not only the charge-based memory cells in the dosimeter subsection are not refreshed, but also the amount of charge pumped in the storage element is not optimal to maximize the lifetime of the device, it is in fact calibrated to fail at a specific TID level.

The TID level can be determined in different ways, or a combination thereof. One way relates to controlling of the failure of memory cells in the second subsection, e.g. each block of programming. For example, a block may fail (or is considered failing) when a pre-determined amount of logical errors has been reached. Another way relates to controlling the increase of logical errors in the memory array and correlating the number of logical errors with a TID level.

Figure 5:
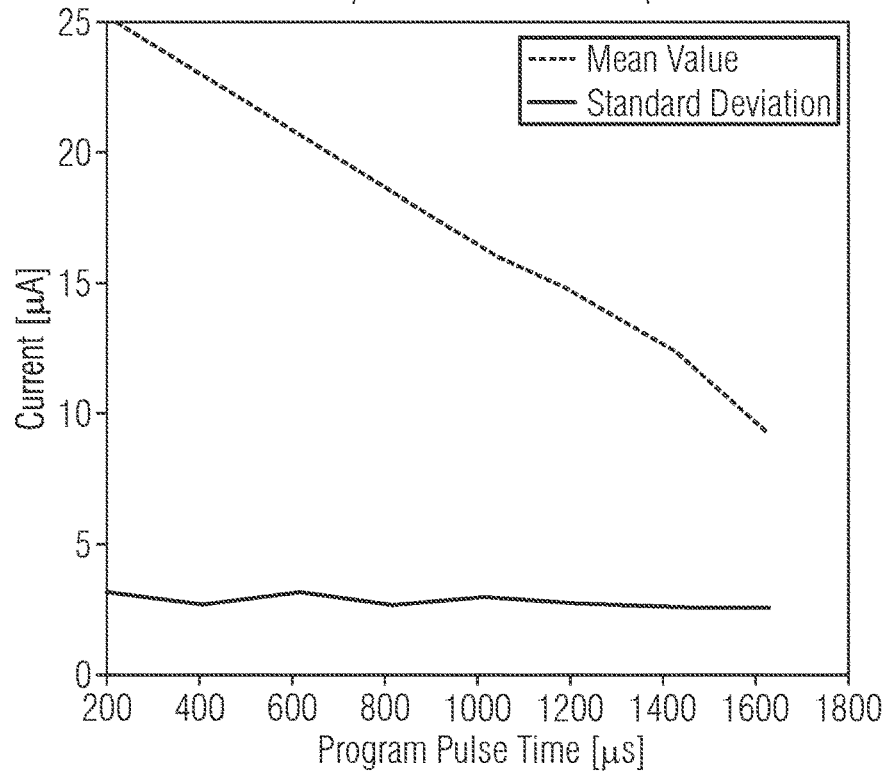
FIG. 5 shows an example distribution of read currents for charge-based memory cells after a program operation.

FIG. 5 shows an example distribution of read currents for charge-based memory cells after a program operation. The graph shows the read current as a function of program pulse time (mean value and standard deviation of the distribution of currents). For example, for charge-based memory cells, the charge injected is controlled by the pulse time in the program operation, i.e. determining a variation in the device current as shown in FIG. 5. The storage element is composed of a silicon nitride spacer, for example. In this way, by having a number of M blocks with different charge amounts therein, it will be possible to identify the level of TID absorbed by the second subsection 420 by analyzing the failure rate of the sectors, in a thermometer fashion in the simplest of cases, with a more sophisticated statistical analysis in the more elaborated. This is possible due to the monotonic behavior of read currents of charge based memory cells, such as sidewall spacer memory bit cells, with respect to TID.

Figure 6:
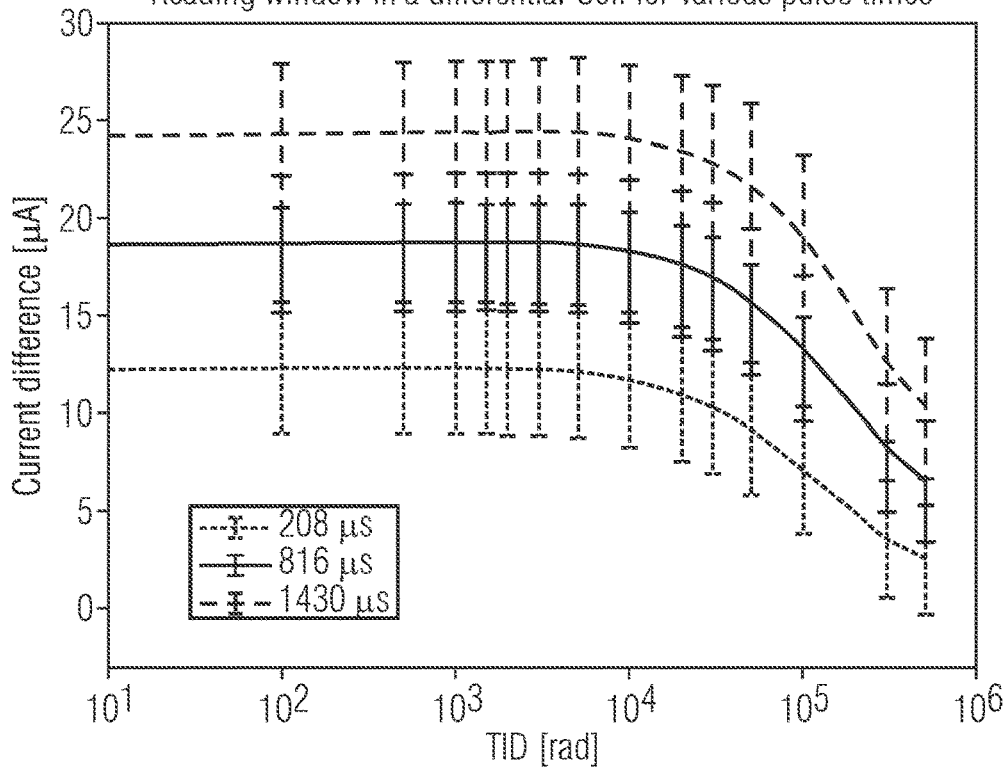
FIG. 6 shows an example time-to-failure diagram for various program pulse times.

FIG. 6 shows an example time-to-failure diagram for various program pulse times. The basis for the graph is a differential sense amplifier architecture. Read current differences are depicted as a function of TID (in logarithmic scale). Each line in the graph shows the current difference between a programmed and non-programmed memory cell. Three different lines are depicted according to different pulse times of the initial programming. The read window, or open window Δ, in the distribution of read currents decreases monotonically with TID. One aspect is that by analyzing only the result of the memory read operations, the data storage apparatus becomes less dependent on analog references. Nonetheless, it is also possible to identify an optimum for a digitally adjustable current reference using the dosimetry subsection as a benchmark for the whole memory array, considering the condition of worst-case scenario for this subsection.

As discussed above with respect to FIG. 3, the dosimeter subsection 420 comprises a number of M blocks of memory cells with the same programming, respectively. One of said M blocks of the dosimeter initially has the same programming conditions as the memory cells of the first subsection 410. This block defines a basis from which to extrapolate a best condition to read the memory array, e.g. by swiping the block and tuning the reference current. In other words, calibration of the reference current for memory access operations may be limited to one block of the second subsection rather than all of them. This block 421, in its initial condition, may be prepared with the same programming as those of the memory cells of the first subsection 410. As the programming of block 421 is never refreshed throughout the operation of the data storage apparatus, a failure of block 421 of same programming identifies a top limit in the tolerance to TID of the whole memory array 400 and, thus, may guarantee a basic performance.

In conclusion, the time-to-failure of the distribution of read currents depends on the amount of charge initially deposited in memory cells of a given block, which is related to the pulse time in the program operation associated to the memory cell. Thus, the pulse time determines the data retention and tolerance to TID of the block. This means that the design of the memory subsection 410 and dosimetry subsection 420 can be dimensioned in view of the operating environment of an electronic device that has the data storage apparatus. As an example, in the medical field, every bit of information is important and the amount of TID deposited in the chips is low compared to High Energy Physics experiments and space applications. Therefore, in a medical application some dosimetry sectors in the memory may be programmed lightly to fail in accordance with the amount of TID received. In the data given in FIG. 6 one can see that the block programmed with 200 μs is much more sensitive to a low TID level than the blocks programmed at 800 μs (the nominal pulse time of program operation for the actual memory subsection.

Figure 7:
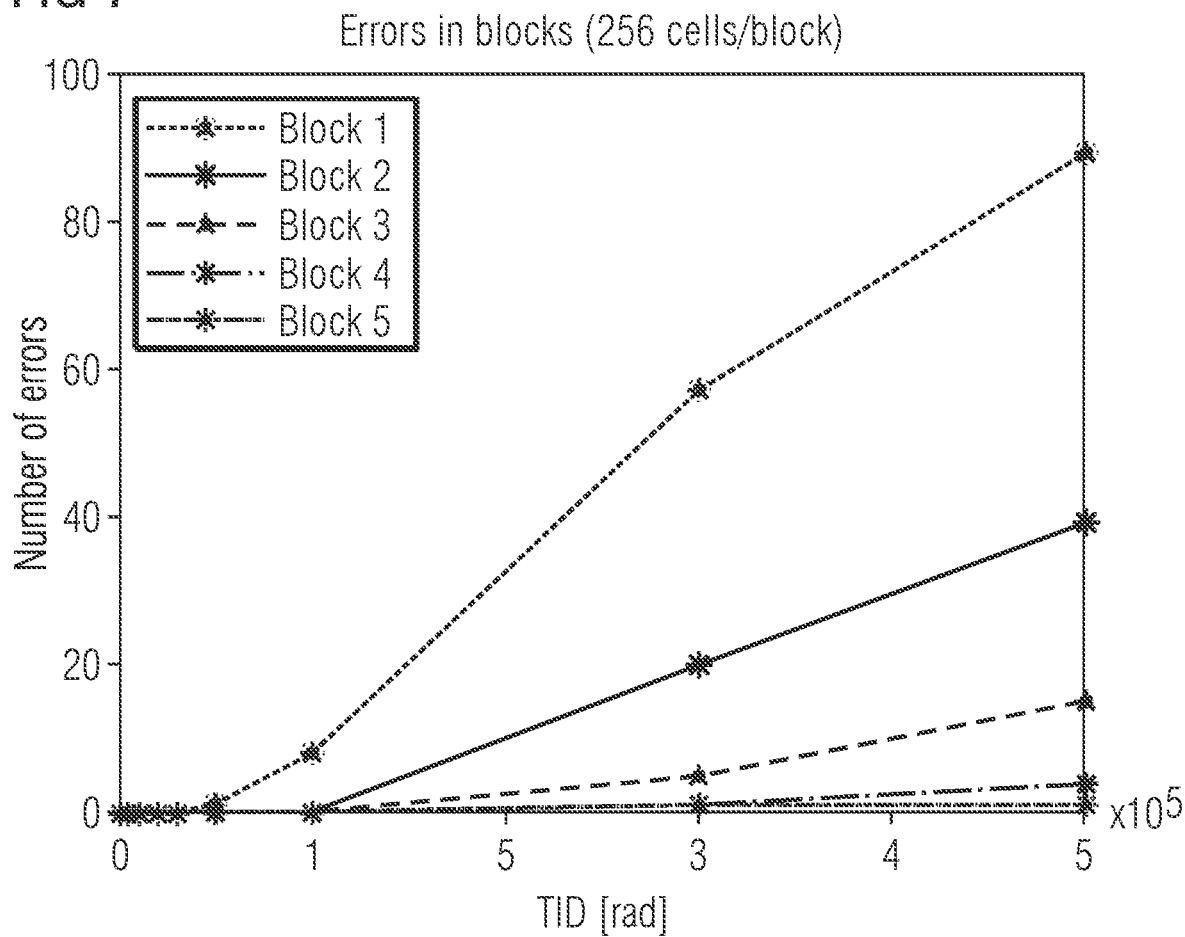
FIG. 7 shows an example graph of detected logical errors for various program pulse times.

FIG. 7 shows an example graph of detected logical errors for various program pulse times. The TID can also be determined from counting a number of logical errors, e.g. using the sense amplifier architecture. The graph depicted in the drawing shows the number of logical errors as a function of TID. In fact, the number of detected logical errors also depends on the different program pulse times that are used to program the memory cells in different blocks.

Radiation induces degradation of charges in charge-based memory cells in a monotonic manner and tends to eliminate charge which has been pumped into the memory cells, e.g. into the nitride spacer. Thus, it is possible to correlate the TID with the charge stored in the cells. This finding is reflected in the number of logical read errors, which can be counted using the sense amplifier (see FIG. 7). In fact, as the data storage apparatus continues to be exposed to ionizing radiation the movement of electronic charge leads to an increase in logical read errors of the memory access operations. The number of logical read errors is indicative also of the Total Ionizing Dose, TID.

Typically, there is a tradeoff between area cost and number of blocks M in the second subsection 420. The relation between the two may determine how accurate the dosimetry can be. However, accuracy can be increased by increasing the granularity, i.e. by analyzing the number of logical errors arising in the blocks and correlating it with a certain TID level. Considering the reduction in the reading window is monotonic, by analyzing the degradation of the open window Δ it is possible to correlate the level of degradation with a level of TID deposited in a given block. However, more blocks are more accurate due to the nonlinear behavior of the degradation of the read window, coupled with the tuning of the pulse time. By tuning the time, the desired amount of charge in the spacer is chosen as well, better defining possible failure points of the block. In FIG. 7 it is possible to see an example of the applied concept. If there happened to be 30 logical errors in block 1, 10 logical errors in block 2 and may be a first failure in block 3, in the example shown in the drawing a dose equivalent to 2 krad was deposited on the data storage apparatus.

In more general terms, the memory and dosimeter subsections occupy certain areas of the memory 400. The area dedicated to dosimetry subsection 420 can be adapted to the system it is applied into, e.g. the data storage apparatus may be implemented into an electronic device which is supposed to operate in a given radiation environment. Other parameters to account for may include the size of the memory. It has been found that a minimum size of the blocks may need to be respected in order to maintain a desired statistical coherence. However, the memory is highly adaptable in terms of how many memory cells may be implemented. For example, second subsection 420 may comprise a number blocks. The actual number may only be limited by a number necessary to obtain the desired accuracy.

It has been found that a minimum size of the blocks can be realized based on the following equation:

$$\frac{Na}{M} \geq 200$$

Herein N denotes the total number of charge-based memory cells of the first subsection, parameter a denotes a fraction of the total number of charge-based memory cells comprised by the second subsection and M denotes a number of blocks in the second subsection.

Considering the basic size of the blocks in these terms, another parameter to take into account may be the tradeoff between the area budget for the proposed data storage apparatus in an electronic device and the desired accuracy in terms of dosimetry steps. This means considering Na, representing the total size of the dosimetry subsection in the block and thus the area cost for the additional function of dosimetry, and M, the number of blocks with different programming depths (and thus different tolerance levels to TID), in relation to the ratio explained above for statistical coherence.

In addition to the size of the dosimetry subsection and blocks, another parameter that can be taken into account is the amount of charge injected into each block, defining the tolerance of each block to radiation and the failure threshold of the specific block. The array of memory cells belonging to the dosimetry subsection 420 may never be refreshed, being then in the worst possible case for data retention. In order to obtain a reliable operation of the data storage apparatus, the size of the dosimetry array Na, the number of sectors M and the amount of charge injected in each memory cell of each block, i.e. the pulse time $t_i$ (e.g. t1, t2, t3, t4, or t5 in FIG. 3) used in the program operation, can be calibrated.

Figure 8:
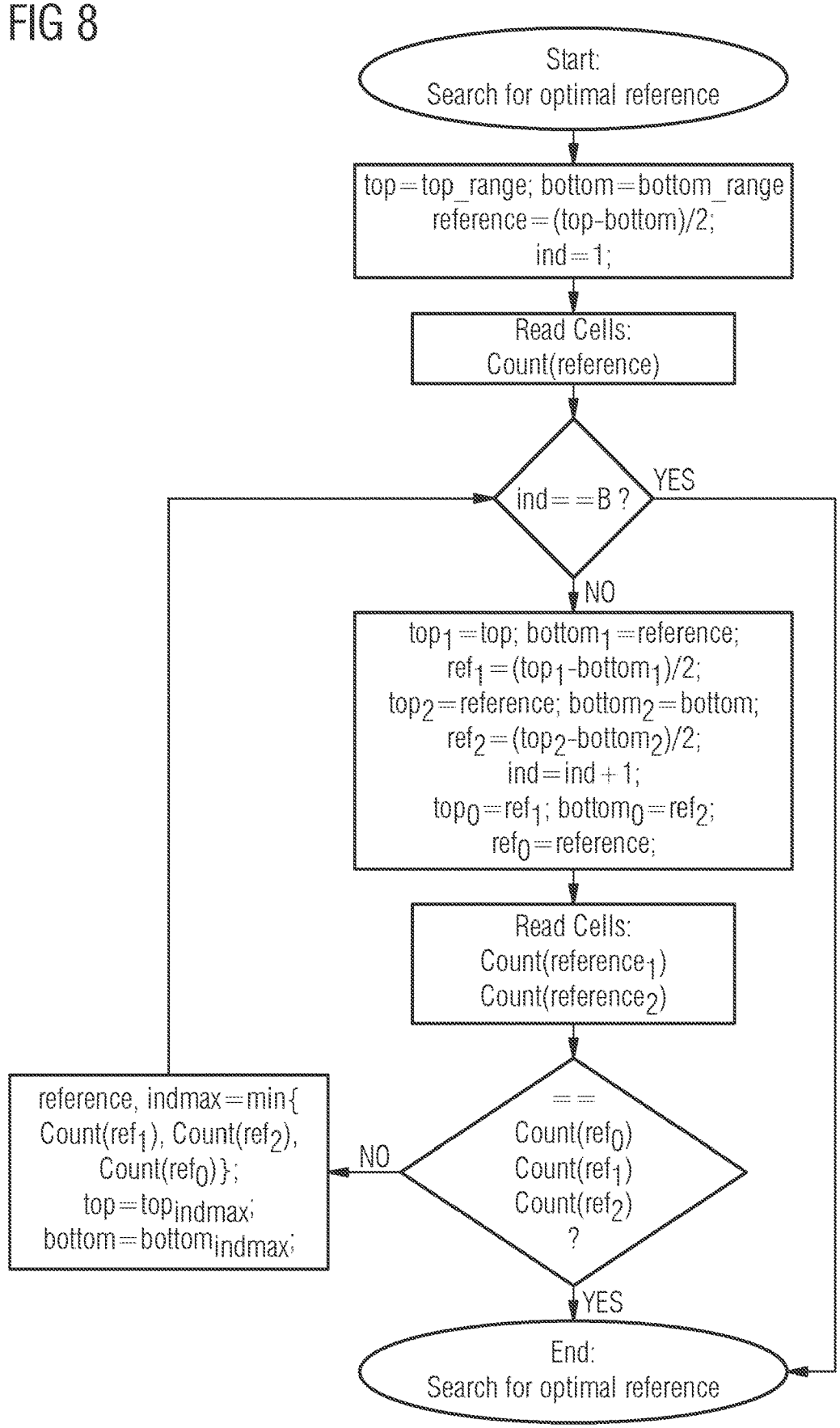
FIG. 8 shows an example flowchart for a method of operating a data storage apparatus.
Figure 9:
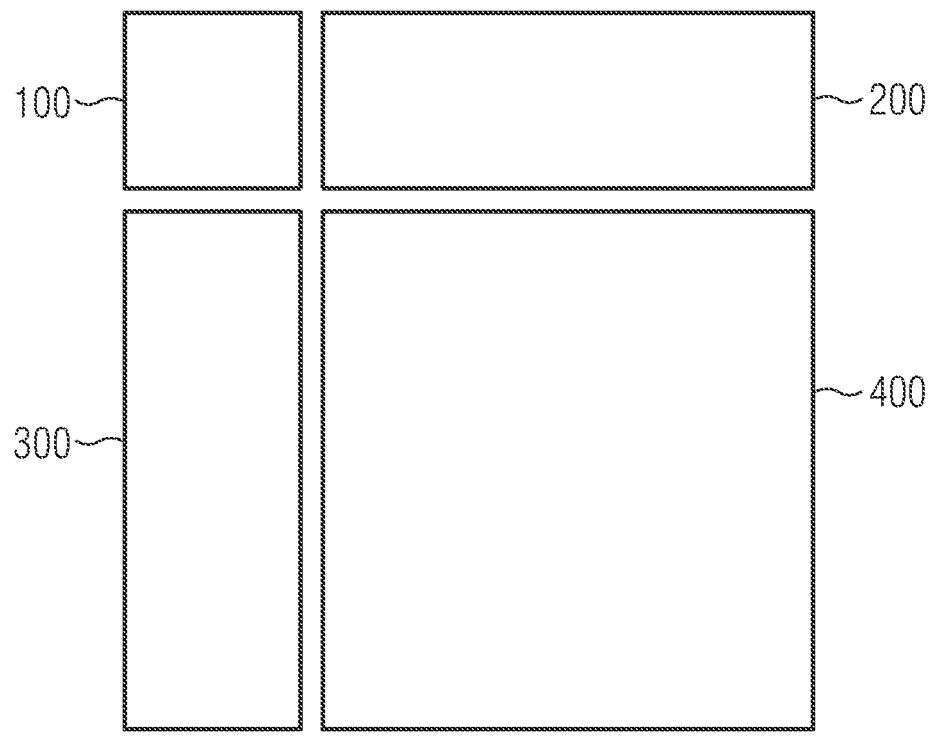
FIG. 9 shows an embodiment of a prior art data storage apparatus.
Figure 10:
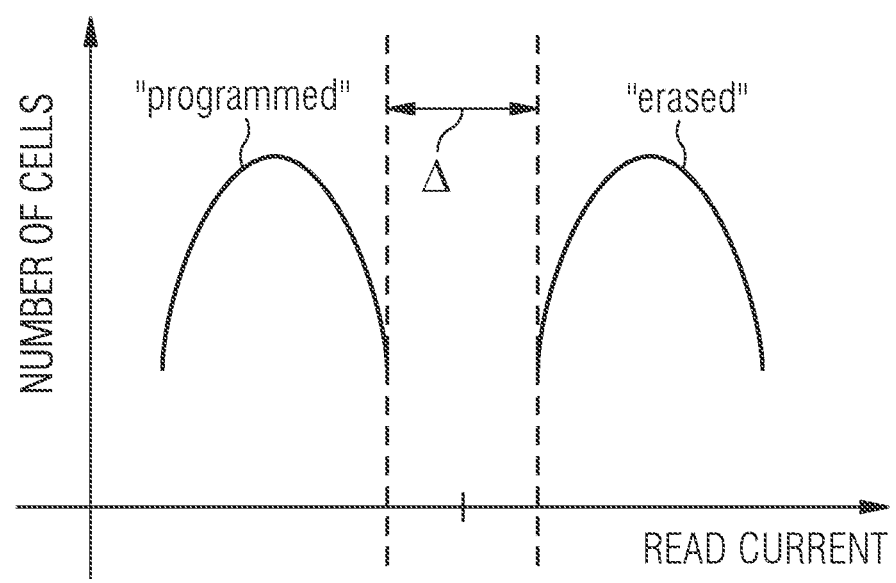
FIG. 10 shows an ideal distribution of the read currents of charge-based bit cells.

FIG. 8 shows an example flowchart for a method of operating a data storage apparatus. The flow chart shows a possible routine for calibrating the reference current Iref. This method can be applied for both the differential structure of the Bit Cell and the single-ended one. The procedure may be applied to the whole dosimeter subsection 420 Failure of the block 421 (with the same programming condition as the memory subsection) is defined by the first error and defines the guaranteed lifetime of the device.

As a general guideline calibration may involve programming the memory with various pulse times or pre-charge conditions and reading of second storage values from the memory cells. Logical read errors are counted in the second subsection, respectively. The number of logical read errors are counted for a given reference current and compared with other numbers of logical errors connected to other different reference currents. The resulting numbers of logical errors of different currents are then processed by identifying the reference that best ensures the longest lifetime of the overall circuit.

In case of a differential structure of the memory cells, calibrating the reference current for the read operation may be a matter of choosing a correct bias for the sense amplifier SA, e.g. a gate voltage for both devices composing the memory cell (see FIG. 2), in order to find an optimum in terms of number of correct operations in the block. The voltage bias Vref constitutes the reference used in the whole array of both memory and dosimetry memory cells 410, 420 and the determination of such reference value comes from the reading of the block in the dosimetry subsection 420 with the same programming conditions as the memory subsection 410. It would mean repeating the calibration operation across the lifetime of the memory to improve the read performance. This holds for both the differential structure and the single-ended one.

The flowchart in FIG. 8 assumes that the control unit 100 comprises a digital-to-analog converter, DAC, for generating the reference current. As already mentioned, FIG. 8 shows one possible sequence of steps to perform to obtain a reference current calibration. The actual operations become clear also from the pseudo program code shown in the drawing and discussed below.

The search for an optimal reference current is started in step S1. In fact, the procedure starts from a midpoint of the digital-to-analog converter. In step S2 a couple of variables are defined. The reference current is denoted reference. Both top_range and bottom_range are defined by the current reference current as a starting point. In the next step S3 the memory cells in the second subsection are read in order to determine the number of logical read errors Count (reference). In particular, for each bit there is a count of logical read errors in the block. This operation is repeated across the generated values of the DAC (following a sort of binary search from the mid-point). In the flowchart, top_range and bottom_range are respectively the maximum and minimum value top, bottom that the reference generation DAC allows.

Step S4 defines that the following algorithm is repeated until index ind reaches the number of bits B. This number defines a granularity of the algorithm.

In step S5 the algorithm starts from the mid-point value of the DAC between top and the reference defined in step S2. Two more references ref1, ref2 are generated (by updating the borders top, bottom of the interval considered for the selection of the reference current). For example, two more references are calculated as follows:

top1=top;bottom1=reference;

ref1=(top1−bottom1)/2;

top2=reference; bottom2=bottom;

ref2=(top2−bottom3)/2;

ind=ind+1;

top0=ref1; bottom0=ref2;

ref0=reference;

In step S6, the control unit 100 recalculates the number of logical read errors in the block for each reference, i.e. based on these definitions and intermediate calculations of references ref0, ref1, and ref2, corresponding numbers of logical read errors Count (reference1) for ref1 and Count (reference2) for ref2 are counted, e.g. assuming this would result in the desired block if the said references would be the point of the DAC under analysis.

Then, in step S7 these three numbers are compared:
Count(ref0)=Count(reference)
Count(ref1)=Count(reference1)
Count(ref2)=Count(reference1), i.e. the two produced with the new step and the old selected point. Then, in step S8, in case the numbers are different, the algorithm selects the new center-point reference that generates the least number of logical read errors, denoted reference,indmax, by updating the interval of the search by returning to step S4. This is achieved by the following calculations:

reference,indmax=min{Count(ref0),Count(ref1);
Count(ref2)};

top=top,indmax,bottom=bottom,indmax

In case numbers indicate an equal number of logical read errors, the center reference is selected in step S9.

In case of a single-ended structure the problem is different. It is far harder to define the best current reference for the single-ended memory cell, which would be a current to compare to the current "saved" in the actual memory cell, to determine if the memory cell has been previously programmed or not, considering the lack of reference memory cells that are instead present in the differential structure.

In order to perform a correct calibration operation a double approach is possible: on one hand, it is possible to isolate an area in the dosimetry subsection that is not to be affected by the program operation, thus identifying one of the blocks as a non-programmed one. This approach comes at the expense of an additional area to obtain the desired calibration. However, this may ensure an accurate comparison of reference currents for both a programmed area and a non-programmed area of the second subsection. For example, there a binary search as discussed above could be executed for the set of reference currents generated by the DACs in the same way as discussed with respect to the flowchart but only in the non-programmed sector. Then a comparison with a programmed area can be used to update the reference current.

Another approach may explore the route of not calibrating the data storage apparatus until a definitive failure of one of the blocks of the second subsection is detected. For example, the blocks can be programmed with different pulse times.

Consider the five blocks 421 to 425 of FIG. 3, having pulse times t1 to t5. Furthermore, assume t1>t2>t3>t4>t5. If prepared in this way the earliest block 421, having the longest pulse time t1 may fail last, together with the memory subsection. In other words, the longer the pulse time, the closer to the programming condition of the memory subsection. If the block with the smallest pulse time starts failing, as indicated by the number of logical read errors, the other blocks can be taken as the trigger for subsequent calibrations. Then, the block 425 being "closer" to a "fresh" memory cell block can act as a non-programmed one, providing a reliable enough comparison for programmed ones and allowing again the binary search for the reference value of the current. "Closer" to a "fresh" memory cells can be seen as closer to one where the program operation was lighter, e.g. defined as the one with the shorter pulse time. This may be a more unreliable method to generate a reference value but in some applications it would be useful, especially the ones that make extensive use of Error Correcting Codes and software techniques to reduce errors in large memories. Equal large memories rather than small ones with OTP for example.

The improved concept laid out above works with various types of charge-based memory cells, since all charge-based Bit Cells react in a similar way to TID. In these specific embodiments shown above, the improved concept is exemplified with the use of the sidewall spacer memory bit cells, however, the same hypothesis works in the same way for other charge-based memory cells or bit cells. Depending on the time of the pulse in the program operation, the current of the memory cell during the read operation also varies, as shown in FIG. 4. Alternative implementations of the basic memory cell, e.g. single-ended or differential structures, do not differ substantially from one another. The read operation is similar, since it is recommended that the current reference be generated with the same cell type as the Sidewall Spacer Memory Device. Therefore whereas in the differential structure the comparison is between the two devices part of the cell itself, in the single-ended implementation the comparison is between a memory cell and a current generated from a similar device (that thus is affected by radiation in the same way). At the same time, the analysis of the dosimetry subsection may be done on a digital basis, counting how many errors incur in the reading, ensuring the independence between dosimetry operation and memory cell structure (i.e. differential or single-ended). Instead, the calibration of the current source to optimize the read operation depends on said structure. However, an optimum for both cases is the same, i.e. the best statistical result at the output. This means that in single-ended cells the optimum is the current level that best separates programmed and erased cells, whereas in the differential implementation a reasonable best bias of the memory cells is the one that returns the highest number of correct answers during read.

To conclude what has been proposed herein it can be stated that the improved concept improves the prior art by coupling the operation of a memory with that of the dosimeter. The prior art solutions, either involve very complex structures for controlling memory wear, or add together separate self-standing blocks that interact then via a higher abstraction layer. Moreover, previous attempts either lack in accuracy of defining effective memory wear (if the dosimeter has a different technology/material compared to the memory device) or require a full scan of the memory to assess the damage level. Thanks to the charge-based memory cells, such as sidewall spacer memory bit cells, and their intrinsic higher tolerance compared to other charge-based devices based on standard CMOS, the proposed concept does not require any special shielding or package for most applications.

The proposed data storage apparatus has the possibility to adapt the layout in the similar way as a memory block. One aspect is that the ratio between charge-based memory cells in the first subsection (memory) and the second subsection (dosimeter) varies with the desired reliability and overall size of the memory, together with memory reference current tuning mechanism. Clearly, the absolute dosimetry information is closely tied to the size of the second subsection uniquely dedicated to dosimetry and to the sensitivity of the current source provided by the control block. Therefore, it may be beneficial to have a non-accurate compact integrated absolute measurement of Total Ionizing Dose (TID) on the electronic system, which works as an accurate and fast adaptive current reference tuning to improve memory tolerance to radiation.

Some of the improvements can be summarized as follows:
- smaller area compared to a separate dosimeter and memory
- high reuse of common blocks (e.g., readout) and high compatibility with existing technology, such as CMOS,
- increased integration at circuit and system level,
- increased memory reliability compared to systems using different technologies,
- simplicity of the proposed invention fosters the reusability of the concept, and
- independence of the method from analog sources.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

A number of implementations have been described. Nevertheless, various modifications may be made without departing from the spirit and scope of the invention. Accordingly, other implementations are within the scope of the claims.

The invention claimed is:

1. A data storage apparatus, comprising an integrated circuit further comprising a control unit and a memory array of charge-based memory cells, wherein:
   the memory array comprises a first subsection which is operable as a memory, and comprises a second subsection which is operable as a dosimeter;
   the control unit is operable to provide a reference current and to conduct memory access operations to access the memory with reference to the reference current; and
   the control unit is further operable to analyze a statistical distribution of read currents by using memory access operations in the second subsection, wherein said analysis involves:
   counting of logical read errors of the memory access operations, and
   calibrating the reference current depending on a number of counted logical read errors being indicative also of a Total Ionizing Dose, TID.

2. The apparatus according to claim 1, further comprising a column control block operable for memory access operations and comprising comparators, and wherein during said memory access operations the comparators are operable to compare read currents with the reference current.

3. The apparatus according to claim 2, wherein:
   the comparators comprise current sense amplifiers configured in a single-ended or in a differential structure, and
   the current sense amplifiers are operable to compare read currents with the reference current, and/or
   the column control block further comprises a data buffer and a bitline driver,
   a row control block (300) comprises a wordline driver.

4. The apparatus according to claim 2, wherein the control block comprises:
   a counter to analyze the statistical distribution of read currents in the second subsection as a function of a number of memory cells, wherein the analysis involves:
   using the current sense amplifiers, successively comparing read currents from the statistical distribution of read currents with the reference current,
   generating for each comparison a logic TRUE or FALSE signal if said comparison meets a comparison criterion or not, and
   counting the number of logical FALSE signals as number of counted logical read errors.

5. The apparatus according to claim 1, wherein the control block is operable to analyze the statistical distribution of read currents by executing the following steps:
   storing data in the memory array by writing first storage values to the charge-based memory cells of the second subsection,
   reading second storage values from the charge-based memory cells of the second subsection, respectively, and
   counting the number of charge-based memory cells of the second subsection which return logical FALSE signals, thus indicating a read current being higher than the reference current and indicating a logical read error.

6. The apparatus according to claim 5, wherein the control block is operable of calibrating the reference current as a function the number of counted logical read errors and performing a memory access operation on the memory cells using the calibrated reference current as reference current.

7. The apparatus according to claim 1, wherein a number of charge-based memory cells of the first subsection is larger than a number of charge-based memory cells of the second subsection.

8. The apparatus according to claim 1, wherein the second subsection comprises at least one block of memory cells having a same programming, where said same programming corresponds to the programming of the memory cells of the first subsection.

9. The apparatus according to claim 8, wherein the control block is operable to, at least for the block of same programming, determine from the read currents a number of errors as a measure of the Total Ionizing Dose, TID.

10. The apparatus according to claim 1, wherein
    the second subsection is sub-divided into blocks of memory cells of different pre-charge conditions, and
    each block has a different pulse time for programming, respectively.

11. The apparatus according to claim 10, wherein N denotes the total number of charge-based memory cells of the first subsection, parameter a denotes a fraction of the total number of charge-based memory cells comprised by the second subsection and M denotes a number of blocks in the second subsection, and wherein:

$$\frac{N \cdot a}{M} \geq 200.$$

12. The apparatus according to claim 1, wherein memory cells comprised by the second subsection are never reprogrammed after the first preparation of said subsection, in particular, programmed with a specific pulse time.

13. An electronic device, comprising a data storage apparatus according to claim 1 and a host system, including at least one of:
    a medical device,
    an aeronautics device,
    a high energy physics detector,
    an integrated wear-controlled space device,
    a portable mobile device for personal use,
    a portable detector for food radioactivity, or
    a portable detector for checking surrounding radioactive activity.

14. A method of operating a data storage apparatus, the apparatus comprising an integrated circuit having a control unit and a memory array of charge-based memory cells, wherein the memory array comprises a first subsection which is operable as a memory, and comprises a second subsection of charge-based memory cells which is operable as a dosimeter; the method comprising:

using the control unit, providing a reference current, conducting memory access operations to access the memory with reference to the reference current to analyze a statistical distribution of read currents, counting logical read errors of the memory access operations in the second subsection, calibrating the reference current depending on a number of counted logical read errors being indicative also of a Total Ionizing Dose, TID.

15. The method according to claim 14, comprising the further steps of:

programming the memory with various pulse time or pre-charge conditions by writing first storage values to the charge-based memory cells of the second subsection and/or erasing data in the memory array, reading second storage values from the memory cells of the second subsection with reference to the reference current and counting the logical errors being indicative of a first reference condition, reading second storage values from the memory cells of the second subsection with reference to at least one intermediate reference current and counting the logical errors being indicative of a second reference condition, comparing the number of logical errors for the first and at least the second reference condition, and calibrating the reference current such that the reference current with the smaller number of logical errors is set as reference current.

* * * * *